(12) United States Patent
Yu et al.

(10) Patent No.: US 6,984,997 B2
(45) Date of Patent: Jan. 10, 2006

(54) METHOD AND SYSTEM FOR TESTING MULTI-CHIP INTEGRATED CIRCUIT MODULES

(75) Inventors: Yuet-Ying Yu, Hopewell Junction, NY (US); Paul F. Bodenweber, Kingston, NY (US); Charles J. Hendricks, Wappingers Falls, NY (US); Frank C. Seelmann, Gardiner, NY (US)

(73) Assignee: International Business Machines Corporation, Armonk, NY (US)

( * ) Notice: Subject to any disclaimer, the term of this patent is extended or adjusted under 35 U.S.C. 154(b) by 107 days.

(21) Appl. No.: 10/714,215

(22) Filed: Nov. 13, 2003

(65) Prior Publication Data

US 2005/0104608 A1    May 19, 2005

(51) Int. Cl.
*G01R 31/02* (2006.01)
(52) U.S. Cl. .................. 324/754; 324/761; 324/758
(58) Field of Classification Search ........ 324/754–762, 324/765, 158.1; 439/482, 824; 33/533
See application file for complete search history.

(56) References Cited

U.S. PATENT DOCUMENTS

| 4,322,682 | A |   | 3/1982 | Schadwill .................. 324/158 |
|---|---|---|---|---|
| 4,352,061 | A | * | 9/1982 | Matrone ...................... 324/754 |
| 4,471,298 | A | * | 9/1984 | Frohlich ..................... 324/72.5 |
| 5,150,042 | A | * | 9/1992 | Look et al. .................. 324/765 |
| 5,206,585 | A |   | 4/1993 | Chang et al. ............... 324/158 |
| 5,216,358 | A | * | 6/1993 | Vaucher ...................... 324/754 |
| 5,500,605 | A |   | 3/1996 | Chang ......................... 324/758 |
| 6,118,288 | A |   | 9/2000 | Kang .......................... 324/754 |
| 6,211,690 | B1 | * | 4/2001 | Fjelstad ...................... 324/761 |

\* cited by examiner

*Primary Examiner*—Vinh P. Nguyen
(74) *Attorney, Agent, or Firm*—Patrick J. Daugherty; Driggs, Lucas, Brubaker & Hogg Co., LPA

(57) ABSTRACT

A system and method for utilizing a multi-probe tester to test an electrical device having a plurality of contact pads. Multi-probe tester test probes and electrical device contact pads are arrayed in a common distribution pitch, wherein at least one test probe is masked, thereby preventing the at least one test probe from returning a test result to the testing apparatus. In one embodiment mask membrane physically prevents at least one test probe from making contact with the electrical device. In another embodiment at least one software command is provided configured to cause an input from at least one test probe to be disregarded during a test routine. Another embodiment features both mask membrane and software command probe masking.

30 Claims, 4 Drawing Sheets

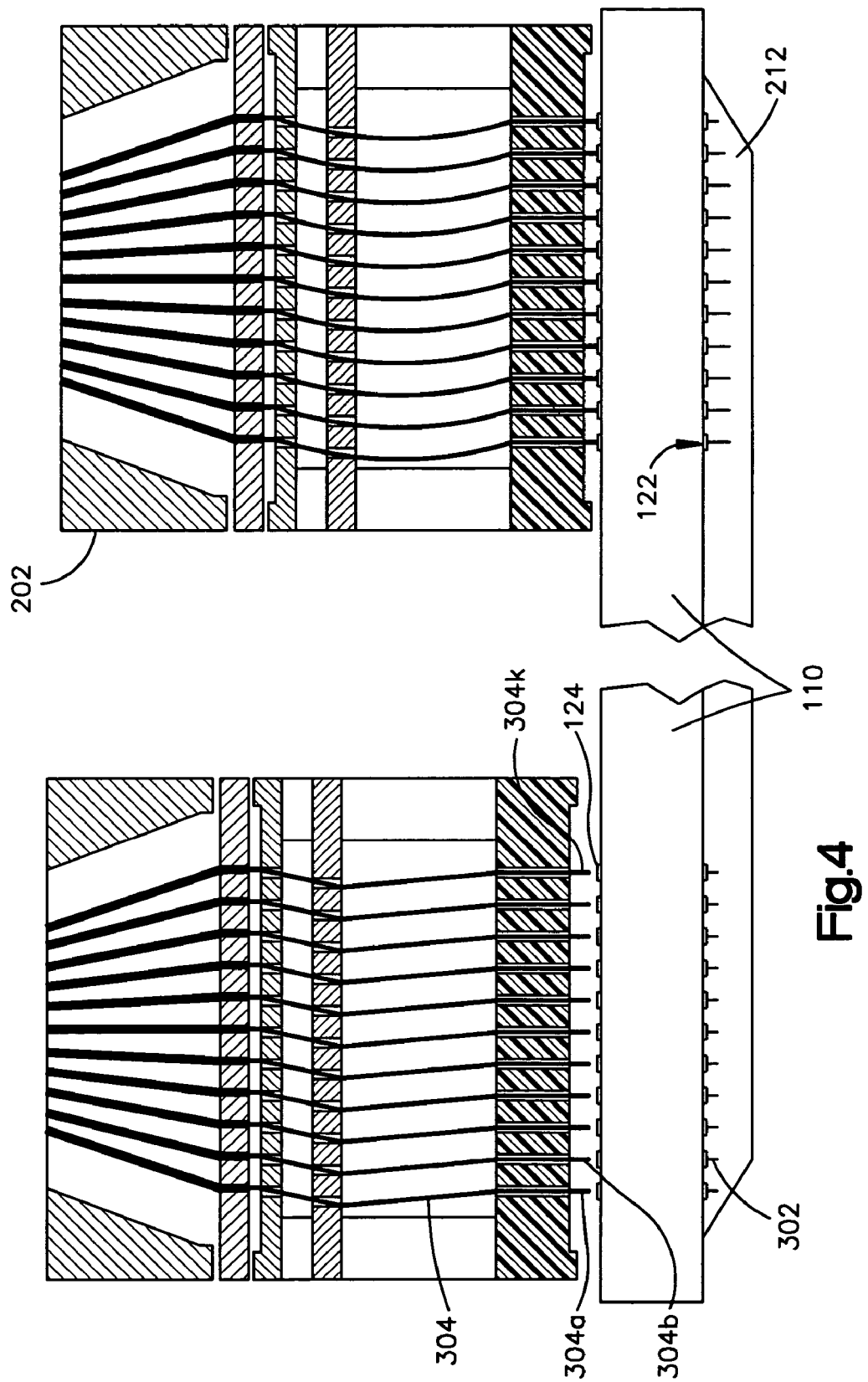

METHOD AND SYSTEM FOR TESTING MULTI-CHIP INTEGRATED CIRCUIT MODULES

FIELD OF THE INVENTION

Methods and systems for testing electrical devices. More particularly, high throughput electrical test methods and systems for complex multi-chip computer system modules MCM's, more particularly step and repeat cluster probe testing of complex multilayer ceramic (MLC) substrates.

BACKGROUND OF THE INVENTION

An important trend in the electronics industry today is the use of multi-chip modules (MCMs). Simply defined, a MCM has multiple integrated circuits (ICs) packaged on an insulting substrate that interconnects the ICs and provides external connections. MCMs create functional islands using both custom and standard chips that can help provide improved system performance and smaller size and weight, while offering a cost-effective solution for many applications.

One example of a high-performance MCM multichip substrate is the IBM Corporation S/390™ product line. FIGS. 1 and 2 illustrate both form-factor and design information on one embodiment 102 of an S/390 MCM. The MCM 102 comprises a plurality of individual chips 110. The chips 110 are formed through a multilayer thick-film technology with a glass-ceramic/copper-metallurgy system. Top surface metallurgy (TSM) "Control Collapse Chip Connection" (C4) pads 124 are arrayed on a top surface 104 of the chip 110. Copper conductors 120 are utilized to form circuitry within the chips 110, said conductors 120 connected to the TSM C4 pads 124 and to bottom surface metallurgy (BSM) I/O pads 122 on the bottom surface 106 on the MCM 102.

The build process for these MCM substrates 102 is highly complex, and electrical testing is performed at several points during the fabrication sequence to minimize the capture time for the detection of unrepairable defects, to drive repair actions, and for the assurance of outgoing-part quality. It is known in the prior art to use capacitive and/or resistive techniques to detect line and via opens and shorts between MCM features. One example is the IBM Corporation-developed electronic module test (EMT™) methodology is used to screen substrates for such latent defects as line neckdowns and via abnormalities, which could lead to opens when used in the field. One means for performing capacitive or resistive test methodology is by using "Step-and-Repeat Cluster-Probe" tester architecture.

FIGS. 3 and 4 provide an illustration of a typical prior art step and repeat cluster probe tester apparatus 200, wherein two buckling beam cluster probe arm testers 202 are used to "step" onto each chip 110 of the MCM 102. A pogo-pin array 212 is brought into electrical contact with the BSM I/O pads 122 of the MSM substrate 110. The two buckling-beam probe arms 202 have a footprint that matches or partially matches with the top surface 104 of each chip 110. Each cluster probe arm 202 has a plurality of "buckling beam" probes 304, wherein each TSM C4 pad 124 is brought into compressive contact with a buckling beam probe 304. The cluster probe tester apparatus 200 control system 204 then indicates a series of tests according to its "tool application program" (TAP). Net (electrical-circuit) configurations are programmed, and testing is executed by the control system 204 via the use of a commercial switching matrix and test engine. The test is highly efficient, with thousands of net tests being executed during one probe move. When a series of tests are complete, the probe arms 202 "step" over to another chip 110 and "repeats" the same test sequence for that chip 110.

However, prior art step-and-repeat cluster-probe testing efficiency has limitations. This mode of testing requires a repeatable C4 pattern that can be stepped with a fixed pad pitch at the level being tested with limits on subfield adjacency to allow for the cluster-probe-beam support structure. As conventionally used in the computer device industry, the term "pitch" refers to the distribution within an array of commonly spaced contact pads or clustered test probes: for example, a "10 mil pitch" may refer to an array of pads with adjacent pads spaced 10 mils from each other, wherein the 10 mil spacing may be specified as a center-to-center spacing or side-to-side spacing dimension. As it is common and desirable for an MCM to comprise chips with a plurality of divergent C4 patterns and/or footprint dimensions, the prior art cluster probe tester cannot efficiently test many MCM's.

Specifically, where smaller footprint chips reside with larger footprint chips on the same MCM, a prior art step-and-repeat probe must cover the larger footprint as a minimum test footprint, which is then repeated for each chip on the MCM regardless of footprint size. Thus when the cluster probe tester tests the smaller footprint some tester contacts are driven into contact with surrounding non-circuitized substrate, or with surrounding circuitry beyond the smaller chip footprint. These surrounding regions commonly have surface depth dimensions divergent from that of the chip, which may cause failure of the cluster probe to correctly interface the chip C4 pads, may cause damage to the surrounding substrate, or may cause the creation of residual debris by an extra the interaction of probe beams with the MCM on smaller chip sites. The removal of residual debris is a significant and expensive problem for large-scale MCM production.

Prior art methods for testing MCM's that have non steppable C4 pattern include "Full Cluster Probe Test" and "Flying Probe Test methods." The Full Cluster Probe Test uses a probe that covers the entire MCM surface C4 pattern comprising all of the chips at once and performs a single step test. This is a high throughput electrical test method, but it requires a huge resource investment on tester and probe. One exemplary MCM may require a probe with approximately 50,000 points and a series of automatic micro adjustment mechanisms. The product-specific manufacturing costs for such a full cluster probe test is enormous, perhaps in the neighborhood of five to six million dollars, and therefore not practical.

The Flying Probe Test tests one net at a time, wherein a single test probe is positioned by a precision x,y table and is put in contact with the MCM C4 pads via a z-motion actuation. This method is most appropriate for latent defect testing of glass-ceramic and thin-film wiring using EMT electronics and for opens/shorts testing at levels in thin films where product design features do not allow cluster probing or for high volume products. Advantages include the absence of significant product-specific fit-up costs and minimal lead time to manufacturing operations. However, disadvantages occur from multi-hour cycle times when used on complex MCM substrates with very high net counts and the resulting high operational costs and high number of required testers to provide the necessary capacity. This method does not require big investment on tooling, but it is a low throughput test method and cannot handle high volume production and is therefore not practical for large scale MCM production.

What is needed is a high throughput electrical test method for complex MCM's. Specifically, what is needed is a test method that utilizes a conventional Step and Repeat Cluster Probe Tester to test complex MCM's that do not have a normal step-able C4 pattern: MCM's comprising chips that have different sizes, sharing a common pitch but with divergent C4 footprints with non-repeating C4 patterns.

SUMMARY OF THE INVENTION

A system and method for utilizing a multi-probe tester to test an electrical device having a plurality of contact pads. Multi-probe tester test probes and electrical device contact pads are arrayed in a common distribution pitch, and a means for masking test probes masks at least one test probe, thereby preventing the at least one test probe from returning a test result to the testing apparatus. In one embodiment the means for masking test probes is a mask membrane physically preventing at least one test probe from making contact with the electrical device. In another embodiment, the means for masking is at least one software command configured to cause an input from at least one test probe to be disregarded during a test routine. Another embodiment features both mask membrane and software command probe masking.

BRIEF DESCRIPTION OF THE DRAWINGS

FIG. 4 is a side sectional view of a typical buckling beam cluster probe tester, illustrated stepping on an array of typical C4 features.

DESCRIPTION OF THE PREFERRED EMBODIMENTS

The present invention is a test method and system that utilizes "masking" methods with a conventional Step and Repeat Cluster Probe Tester to test complex MCM's comprising different size chips sharing a common pitch but with divergent C4 footprints with non-repeating C4 patterns. These types of complex MCM's thus have surface features that are not appropriate for testing through a normal stepable C4 pattern.

Figure 5:
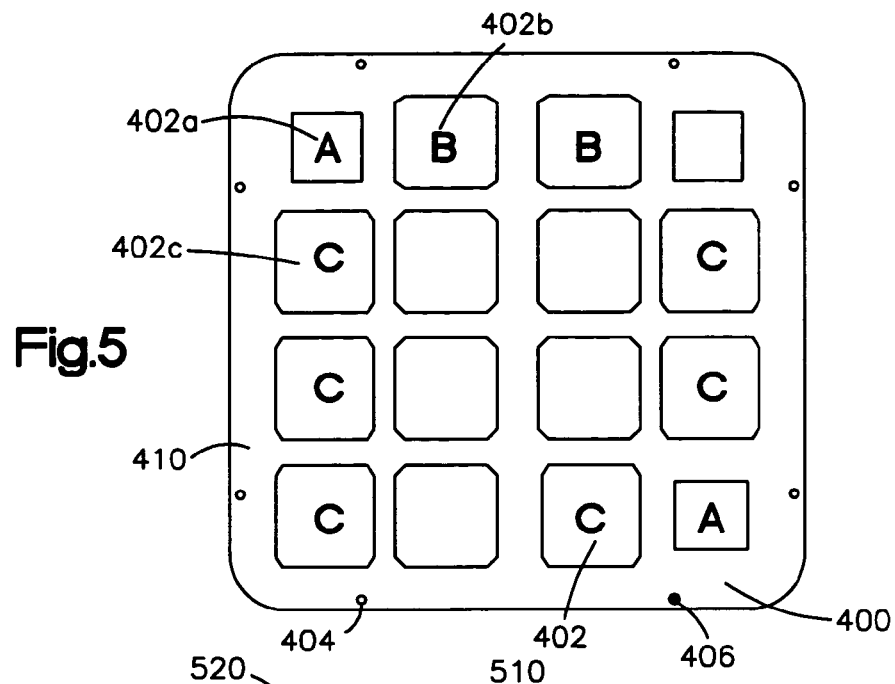
FIG. 5 is a top plan view of a mask according to the present invention.

Referring now to FIG. 5, a self-locate mask 400 according to the present invention is shown. The mask provides a template that exposes only the chip features to be tested through a plurality of mask apertures 402. Each aperture 402 has a shape designed to expose only those chip areas to be tested to the cluster probe arm 202. For example, it is readily apparent from the drawings that aperture 402a has a much smaller opening area than that of 402b.

One embodiment of the mask 400 is manufactured from a sheet of Kapton™, made by Dupont, Inc., with thickness of from about 2 to about 3 mils. However, many other thin, flexible and resilient materials may be suitable for the mask (such as Mylar), and the invention is not limited to the present embodiment.

The present mask 400 may also define frame alignment apertures 404. These small apertures 404 are formed to receive alignment dowels 406, which project from a self-locating frame 500. It is preferred that the mask 400 placed on the alignment frame 500 through alignment with the dowels 406, then firmly affixed to the frame 500 through an adhesive means. Once the adhesive means is set the dowels 406 are preferably removed from the mask 400 and frame 500. Then the assembly of the frame 500 and mask 400 may be quickly applied and removed from a corresponding MCM 510 being tested, enabling improved efficiencies in testing time requirements. One embodiment of the frame 500 is plastic; however any light-weight rigid frame material is suitable, and the invention is not limited to the present embodiment.

Figure 6:
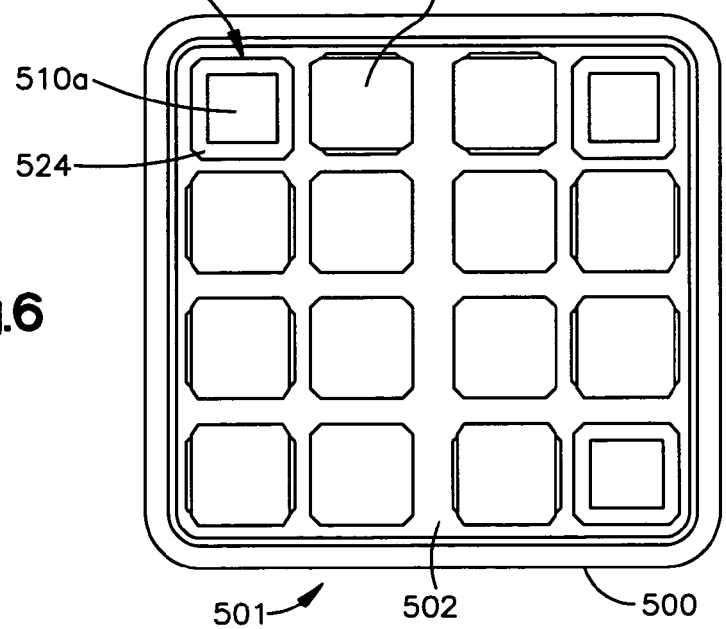
FIG. 6 is a top plan view of a mask and frame assembly according to the present invention positioned upon a MCM with cluster probe tester and MCM footprints superimposed.
Figure 7:
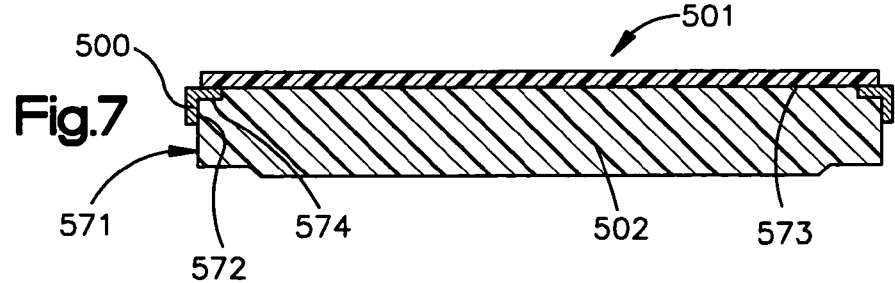
FIG. 7 is a side view of a mask and frame assembly according to the present invention positioned upon an MCM substrate.
Figure 8:
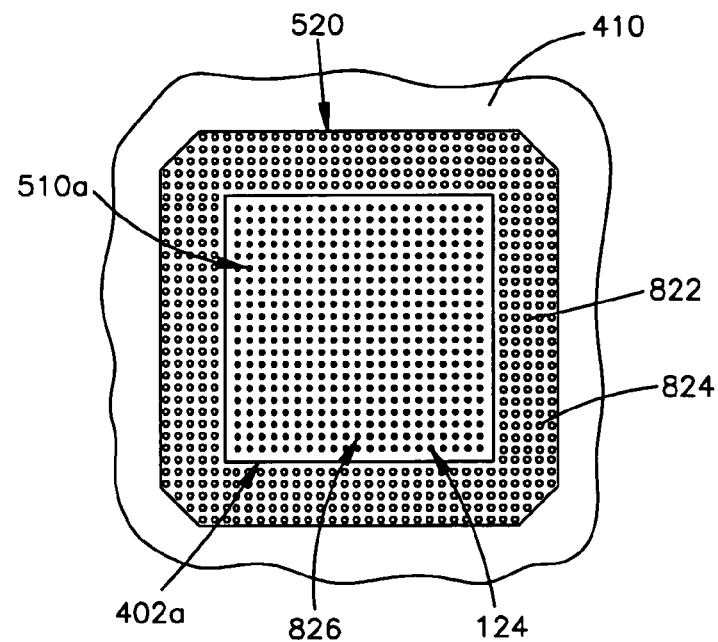
FIG. 8 is a top detail plan view of a mask aperture and MCM chip from FIG. 6.

FIG. 6 is a top plan view of an assembly 501 of the mask 400 and frame 500 positioned upon a complex MCM 502 according to the present invention. FIG. 7 is a side view of the assembly 501, and FIG. 8 is a top detail plan view of a mask aperture 402a and MCM chip 510a from FIG. 6. Vertical interior frame surfaces 572 rest against MCM exterior substrate vertical surfaces 571, and horizontal bottom frame surfaces 574 rest against MCM substrate top surfaces 573, wherein these surface interactions cause the frame 500 to be aligned upon the MCM substrate 502, and accordingly the mask 400 apertures 402 with the chips 510. As illustrated the superimposed cluster probe tester footprint 520 is the same for each "step and repeat" test iteration for each chip 510. What is new is that the mask 400 prevents unwanted cluster probe 304 contact with regions beyond the mask apertures 402 by providing a physical barrier. The probes 304 located outside the mask aperture 402 define an excluded footprint 822 of mask contact points 824 which are brought into contact with the mask upper surface 410. Only the probes 304 located within the aperture 402 define a contact array 826 that contacts the chip 510a, and in particular the TSM pads 124 located thereupon. This prevents damage to MCM regions surrounding specific chips 502; the creation of debris through undesirable probe 304 contact with surrounding substrate 502 materials; and false test results from the inadvertent testing of surrounding circuit features that should be excluded during the test sequence.

Where the mask is made from Kapton™ or other non-conductive materials, then the probes 304 contacting the mask surface 410 will not form an electrical connection to any other circuit point, and thus false electrical connection test results will be prevented. Although this mask behavior is preferred, the mask surface 510 may also be comprised of conductive materials: for example, wiring (not shown) may be present on the mask surface 510 to from selective probe 310 electrical connections. Alternatively, regions of the mask (not shown) may also be selectively conductive, if required for testing requirements. Thus the present invention is not restricted to non-conductive mask surface 410 materials.

The TSM pads 124 typically have a diameter of about 4 mils, although the present invention is adaptable to other diameters.

Figure 9:
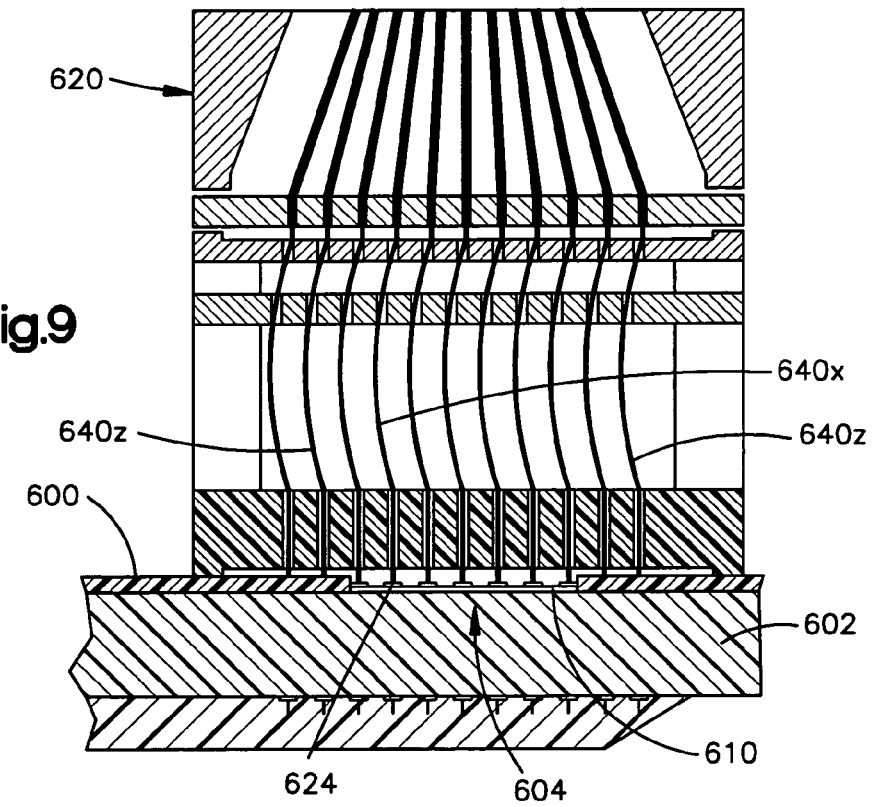
FIG. 9 is a side sectional view of a cluster probe tester, mask and MCM according to the present invention

FIG. 9 depicts another embodiment of the present invention. A Kapton™ mask 600 is shown deployed upon an MCM 602 top surface. The mask 600 forms an aperture 604, through which a chip 610 projects. A buckling beam cluster probe tester 620 is shown "stepped" onto the mask 600 and chip 610, wherein cluster probes 640 are brought into contact with the chip 610 and mask 600. Probes 640x make an electrical connection with TSM pads 624, and probes 640z contact the mask 600.

An advantage of a typical buckling beam cluster probe tester 620 is that the "buckling beam" probes 640 are configured to exert a constant or maximum force over a range of probe travel and corresponding compressive deflection. Any MCM cluster probe array must typically allow for 3 mils of travel to account for typical MCM surface feature depth differences. In order to accommodate the thickness of the Kapton™ mask 600 of the present embodiment, as well as the MCM 602 surface feature depth differences, it is preferred that the beam probes 640 utilized with the present invention accommodate about 6 plus mils of travel differential between the probes 640x in compressive electrical connection with the TSM pads 624 and the probes 640z in compressive contact the mask 600. However, other buckling beam probes (not illustrated) with a larger or smaller range of travel per constant or maximum compressive force output may be utilized with the present invention, and the invention is not limited to the exemplary embodiments described herein. What is important is that the forces exerted by the probes 640 do not vary greatly over the travel differential: once a beam 640 is buckled, additional travel does not exert substantially more force upon either the MCM 602 or mask 620, thus enabling masks of a thickness within the range of travel adaptable for use with invention.

In another embodiment of the invention a method of programming a cluster probe tool application program (TAP) is provided. Configuration mask commands are input into the TAP. When present in the test data these mask commands isolate extra probe beams 304 by creating "don't care" terminals on the product 510 being tested. The input switches for masked addresses are deactivated so connections from the output terminal to them cannot cause an error in a short scan and avoid putting out invalid "open" result addresses for the extra probe beams. Exemplary commands are "SH" (Reset All Masks); "SA" (Reset All Masks at specified electronic address and higher); "SB" (Reset mask at all other addresses); and "SU" (Set mask at specified electronic address).

As is well known in the art, step and repeat cluster probe "probe points" 304 used to contact the TSM C4 pads 124 are assigned electronic addresses by the TAP. Where the probe points 304 shown in FIG. 4 may be labeled in a consecutive fashion with labels 304a through 304k, an exemplary address table may read as follows:

| Electronic Address | Probe Point |
| --- | --- |
| 00001 | 304a |
| 00002 | 304b |
| 00003 | 304c |
| 00004 | 304d |
| 00005 | 304e |
| 00006 | 304f |
| 00007 | 304g |

-continued

| Electronic Address | Probe Point |
| --- | --- |
| 00008 | 304h |
| 00009 | 304i |
| 00010 | 304j |
| 00011 | 304k; | where the electronic address are matrix address corresponding to specific probe points 304.

For a "Shorts Scan" of an MCM using a prior art cluster probe tester, if there is a short between probe points 304a and 304b, and these probes are within an area surrounding the chip 510 and therefore not in contact with the chip 510 TSM C4 pads 124, the tester may nevertheless detect and report a short during the shorts scan. Thus a "false" short caused by conductive debris deposited upon a mask surface on the MCM may be reported as a circuit failure However, if we wish to avoid a specific probe point short test, according to the present invention we may enable the mask bit at matrix address 00001 by the "set mask command":

Test Command=SU00001.

Now when the cluster probe "shorts scan" test is run the short between probe points 304a and 304b would not be found. In a similar fashion, for an "Opens Detection" test, according to the present invention unused electronic addresses are disabled by using the SU command for each probe point to be disregarded.

It is preferred that the commands are input to the TAP corresponding to each chip 510 appearing on the MCM 502. Thus, specific commands are correlated to the specific mask apertures: for example, some commands are input for a test sequence operating upon aperture 402a; and other set of commands for aperture 402b; a third set of commands for aperture 402c.

Figure 3:
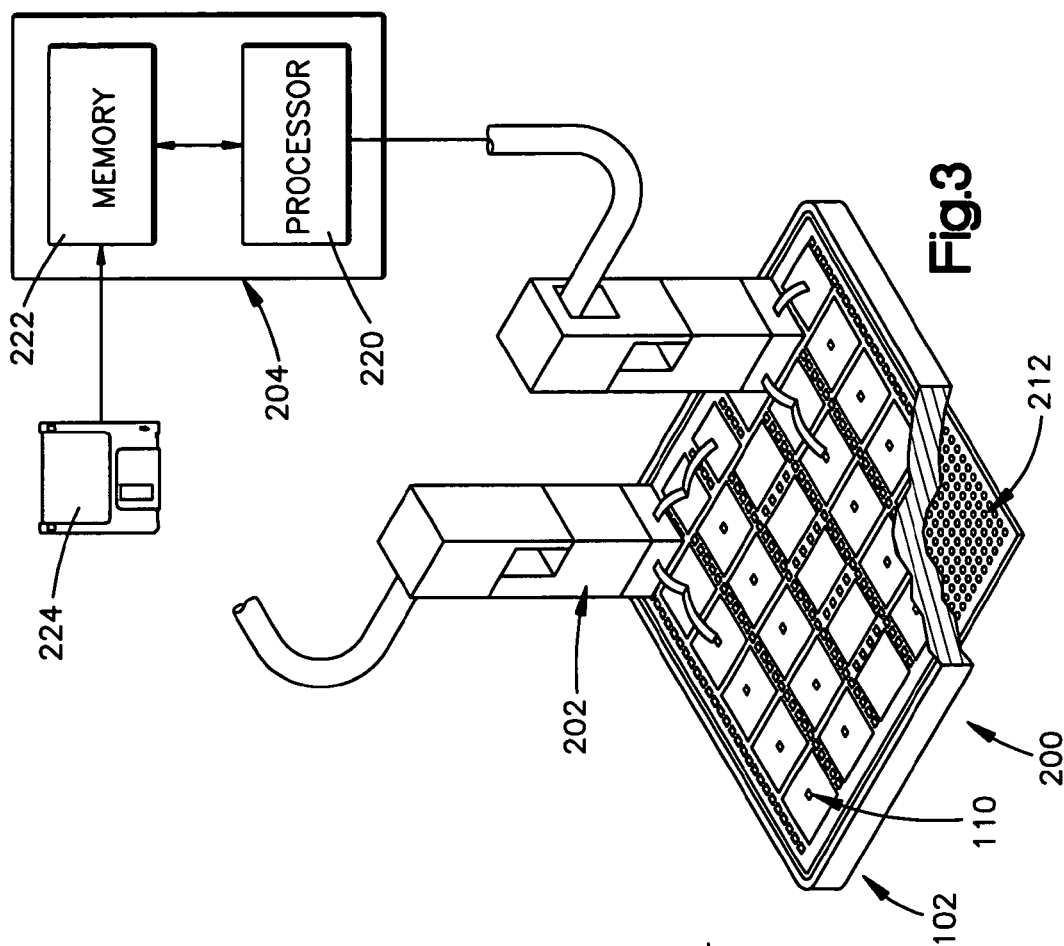
FIG. 3 is a side perspective illustration of a prior art step and repeat cluster probe tester apparatus.
Figure 1:
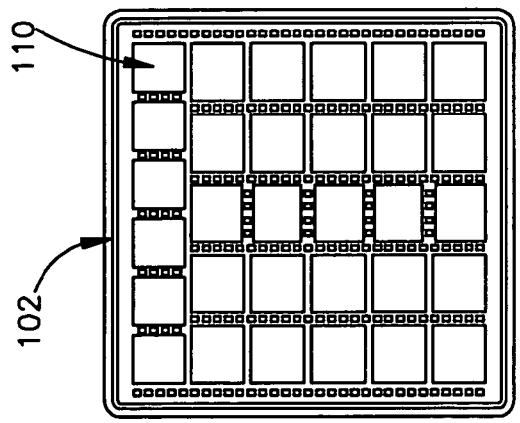
FIG. 1 is a set of top plan of an MCM.
Figure 2:
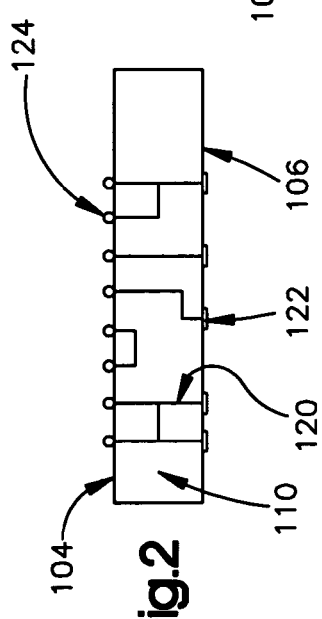
FIG. 2 is a side sectional view of a chip residing on the MCM of FIG. 1.

In one embodiment of the present invention 15 mask commands are available for TAP input, however the present invention may be practiced with more or less commands. Cluster probe tester TAP's are unique to each testing apparatus, with each manufacturer utilizing its own proprietary TAP. The present invention may be adapted to be practiced with any TAP by the manufacturer, or by an end user with the cooperation of the manufacturer. Referring again to FIG. 3, an embodiment of the invention described above may be tangibly embodied in a in a computer program residing on a computer-readable medium or carrier 224. The medium 224 may comprise one or more of a fixed and/or removable data storage device such as a floppy disk or a CD-ROM, or it may consist of some other type of data storage or data communications device. The computer program may be loaded into the memory 222 to configure the processor 220 of the cluster probe tester apparatus 200 control system 204 for execution. The computer program comprises instructions which, when read and executed by the processor 220 causes the processor 220 to perform the steps necessary to execute the steps or elements of the present invention.

In one embodiment of the present invention, one cluster probe design covers all signal nets for all five different chips.

Alternatively, the present invention may be practiced with the TAP command sets alone without any physical mask element. In this embodiment commands are input into the TAP to prevent false test results, without the need for a physical masking element to provide a physical mask barrier: undesired connections or test results are disregarded through the TAP.

While preferred embodiments of the invention have been described herein, variations in the design may be made, and such variations may be apparent to those skilled in the art of testing electronic devices, as well as to those skilled in other arts. The materials identified above are by no means the only materials suitable for the manufacture of the embodiments described herein, and substitute materials will be readily apparent to one skilled in the art. The scope of the invention, therefore, is only to be limited by the following claims.

What is claimed is:

1. A system for utilizing a multi-probe tester to test an electrical device having a plurality of contact pads, comprising:
   (a) a multi-probe tester having a plurality of test probes arrayed in a distribution pitch, the multi-probe tester further comprising a tool application program configured to control the plurality of probes;
   (b) an electrical circuit testing apparatus in circuit connection with the multi-probe tester; and
   (c) a means for masking test probes;
   wherein the module has a top surface comprising a first electrical device, the first electrical device having a first plurality of contact pads arrayed in the distribution pitch on a first device top surface;
   wherein the means for masking test probes is configured to mask at least one first test probe when the plurality of test probes is brought into contact with the first device top surface to form a first electrical engagement with the first plurality of contact pads and a circuit test is run by the testing apparatus, thereby preventing the first at least one test probe from returning a test result to the testing apparatus; and
   wherein the means for masking test probes comprises at least one software command loaded into the tool application program, said at least one software command configured to cause an input from the first at least one test probe to be disreguarded during a test routine.

2. The system of claim 1 wherein the means for masking test probes further comprises a mask membrane defining a first aperture, the mask membrane disposed between the first device top surface and the plurality of test probes wherein the first at least one test probe is aligned to contact the mask membrane and a first remainder of the test probes is aligned within the first aperture thereby passing through the mask membrane, the mask membrane thereby physically preventing the first at least one test probe from making contact with the module top surface.

3. The system of claim 2 wherein:
   the first plurality of contact pads is arranged in a first pad array defining a composite two-dimensional first contact pad footprint;
   the plurality of test probes is arranged in a probe array defining a composite two-dimensional probe footprint, the composite probe footprint divergent from the first contact pad array footprint; and
   the first at least one test probe is located outside of the composite first pad array footprint when a first remainder of the array of probes is brought into the first electrical engagement with the first array of contact pads.

4. The system of claim 3 wherein the module further comprises a second electrical device having a second plurality of contact pads on a top surface arrayed in the distribution pitch in a second pad array defining a composite two-dimensional second contact pad footprint divergent from the first contact pad footprint;
   the mask membrane further defining a second aperture, the membrane aligned with the first plurality of contact pads passing through the first aperture and the second plurality of contact pads passing through the second aperture;
   wherein the test routine comprises first and second test steps, wherein the multi-probe tester performs the first test step by aligning the plurality of test probes with the first plurality of contact pads with the first at least one probe located outside of the first contact pad footprint and bringing the first at least one probe into contact with the mask membrane and a first remainder of the plurality of test probes passing through the first aperture and into electrical contact with the first array of contact pads in the first electrical engagement; and
   the multi-probe tester perform the second test step by subsequently aligning the plurality of test probes with the second plurality of contact pads with a second at least one probe located inside the first pad footprint and outside of the second contact pad footprint and bringing the second at least one probe into contact with the mask membrane and a second remainder of the plurality of test probes passing through the second aperture and into electrical contact with the second array of contact pads in a second electrical engagement.

5. The system of claim 4 wherein the at least one software command causes an input from the first at least one test probe to be disregarded in the first test step and the second at least one probe to be disregarded in the second test step.

6. The system of claim 5 wherein the first and second at least one probes exert a common maximum force on the membrane and the first and second remainder of probes exert the common maximum force upon the contact pads.

7. The system of claim 6 further comprising an alignment frame attached the mask membrane, the frame configured to interact with the module to align the first aperture with the first device and the second aperture with the second device.

8. A method for utilizing a multi-probe tester to test an electrical device having a plurality of contact pads, comprising the steps of:
   providing a multi-probe tester having a plurality of test probes arrayed in a distribution pitch;
   providing an electrical circuit testing apparatus in circuit connection with the multi-probe tester;
   providing a tool application program for the multi-probe tester configured to control the plurality of probes;
   providing a means for masking test probes comprising at least one software command loaded into the tool application program;
   providing a module having a top surface comprising a first electrical device, the first electrical device having a first plurality of contact pads arrayed in the distribution pitch on a first device top surface;
   aligning the test probe array pitch with the first contact pad array pitch;
   bringing at least some of the plurality of test probes into electrical contact with the first plurality of contact pads to form a first electrical engagement;
   the program running the at least one software command;
   the multi-probe tester disregarding an input from a first at least one test probe responsive to the software command during the test routine, the means for masking test probes thereby masking the first at least one test probe; and
   the testing apparatus running a circuit test with the probes, wherein the first at least one test probe is prevented from returning a test result to the testing apparatus.

9. The method of claim 8 wherein the means for masking test probes further comprises a mask membrane defining a first aperture; further comprising the steps of:
- aligning the first aperture with the first plurality of contact pads;
- disposing the mask membrane between the first device top surface and the plurality of test probes;
- bringing the first at least one test probe into contact with the mask membrane thereby physically preventing the first at least one test probe from making contact with the module top surface.

10. The method of claim 9 further comprising the steps of:
- arranging the first plurality of contact pads in a first pad array defining a composite two-dimensional first contact pad footprint;
- arranging the plurality of test probes in a probe array defining a composite two-dimensional probe footprint, the composite probe footprint divergent from the first contact pad array footprint; and
- wherein the first at least one test probe is located outside of the composite first pad array footprint when a first remainder of the array of probes is brought into the first electrical engagement with the first array of contact pads in the first electrical engagement of step (f).

11. The method of claim 10 wherein the module further comprises a second electrical device having a second plurality of contact pads on a top surface arrayed in the distribution pitch in a second pad array defining a composite two-dimensional second contact pad footprint divergent from the first contact pad footprint;
- the mask membrane further defining a second aperture;
- the step aligning the first aperture with the first plurality of contact pads further comprises aligning the second plurality of contact pads with the second aperture;
- wherein the test routine comprises first and second test steps;
- the multi-probe tester performing the first test step by aligning the plurality of test probes with the first plurality of contact pads with the first at least one probe located outside of the first contact pad footprint and bringing the first at least one probe into contact with the mask membrane and a first remainder of the plurality of test probes passing through the first aperture and into electrical contact with the first array of contact pads in the first electrical engagement; and
- the multi-probe tester performing the second test step by subsequently aligning the plurality of test probes with the second plurality of contact pads with a second at least one probe located inside the first contact pad footprint and outside of the second contact pad footprint and bringing the second at least one probe into contact with the mask membrane and a second remainder of the plurality of test probes passing through the second aperture and into electrical contact with the second array of contact pads in a second electrical engagement.

12. The method of claim 11 wherein the at least one software command causes an input from the first at least one test probe to be disregarded in the first test step and the second at least one probe to be disregarded in the second test step.

13. The method of claim 12 wherein the first and second at least one probes exert a common maximum force on the membrane and the first and second remainder of probes exert the common maximum force upon the contact pads.

14. The method of claim 13 further comprising:
- providing an alignment frame attached the mask membrane;
- the frame interacting with the module to align the first aperture with the first device and the second aperture with the second device.

15. An article of manufacture comprising a computer usable medium having a computer readable tool application program embodied in said medium, wherein the computer readable tool application program, when executed on a computer-controlled multi-probe tester system, the computer control system having a plurality of test probes arrayed in a distrubution pitch and a computer control system, the computer control system configured to control the plurality of test probes, an electrical circuit testing apparatus in circuit connection with the multi-probe tester, causes the computer control system to:
- load a means for masking test probes comprising at least one software command into the tool application program;
- align the test probe array distribution pitch with a first plurality of contact pads arrayed in the distribution pitch on a first electrical device top surface
- bring at least some of the plurality of test probes into electrical contact with the first plurality of contact pads to form a first electrical engagement;
- the program run the at least one software command;
- the multi-probe tester select and disregard a first at least one test probe input from a test routine executed on the probes; and
- the testing apparatus run a circuit test with the probes, wherein the first at least one test probe is prevented from returning a test result to the testing apparatus.

16. The article of manufacture of claim 15 wherein the test routine comprises first and second test steps, wherein the computer readable program, when executed on the computer configured to control the plurality of test probes, causes the computer to select and disregard at least one first test probe input from the first step; and
- further causes the computer to select and disregard a second at least one probe in the second test step.

17. A system for utilizing a cluster probe tester to test an electrical device having a plurality of contact pads, comprising:
- (a) a cluster probe tester having a plurality of test probes arrayed in a distribution pitch defining a composite two-dimensional probe footprint and configured to run a test routine comprising a first test step;
- (b) an electrical circuit testing apparatus in circuit connection with the cluster probe tester plurality of test probes; and
- (c) a mask membrane disposed between the electrical device and the plurality of test probes, the mask membrane defining a first aperture;
- wherein the electrical device is a module having a top surface comprising a first electrical device, the first electrical device having a first plurality of contact pads arrayed in the distribution pitch on a first device top surface, the first plurality of contact pads defining a composite two-dimensional first contact pad footprint divergent from the probe footprint, the first plurality of contact pads aligned with the first aperture;
- wherein the cluster probe tester is configured to perform the first test step by aligning the plurality of test probes with the first plurality of contact pads and the first aperture, wherein a first cluster probe located outside of the first contact pad footprint is brought into contact with the mask membrane and a first remainder of the plurality of cluster test probes passes through the first aperture and into electrical contact with the first array of contact pads in a first electrical engagement, the membrane thereby preventing engagement of the first probe with the electrical device and return of a test result from the first probe to the testing apparatus.

18. The system of claim 17, wherein the cluster probe tester is further configured to run a test routine second test step and the mask membrane define a second aperture; and
the module top surface further comprising a second electrical device having a second plurality of contact pads arrayed in the distribution pitch on a second device top surface, the second plurality of contact pads defining a composite two-dimensional second contact pad footprint divergent from the probe footprint and the first contact pad footprint, the second plurality of contact pads aligned with the second aperture;
the cluster probe tester further configured to perform the second test step by aligning the plurality of test probes with the second plurality of contact pads and the second aperture with a second probe located inside the first pad footprint and outside of the second contact pad footprint and bringing the second probe into contact with the mask membrane and a second remainder of the plurality of test probes passing through the second aperture and into electrical contact with the second array of contact pads in a second electrical engagement, the membrane thereby preventing engagement of the second probe with the electrical device and return of a test result from the second probe to the testing apparatus.

19. The system of claim 17 wherein the mask membrane is a flexible and resilient non-conductive membrane.

20. The system of claim 19 wherein the mask membrane is selected from the group comprising Kapton and Mylar.

21. The system of claim 17 wherein the cluster probes have a travel distance dimension of about 3 mils; and
the mask membrane has a thickness of from about 2 to about 3 mils.

22. The system of claim 18 wherein the first and second at least one probes exert a common maximum force on the membrane and the first and second remainder of probes exert the common maximum force upon the contact pads.

23. The system of claim 17 wherein the mask membrane is a further comprising an alignment frame attached to the mask membrane, the frame configured to interact with the module to align the first aperture with the first array of contact pads.

24. A method for utilizing a cluster probe tester to test an electrical device having a plurality of contact pads, comprising the steps of:
providing a cluster probe tester having a plurality of test probes arrayed in a distribution pitch defining a composite two-dimensional probe footprint;
providing an electrical circuit testing apparatus in circuit connection with the cluster probe tester plurality of test probes;
providing a module having a top surface comprising a first electrical device having a first plurality of contact pads arrayed in the distribution pitch on a first device top surface defining a composite two-dimensional first contact pad footprint divergent from the probe footprint,
disposing a mask membrane between the module top surface and the plurality of test probes, the mask membrane defining a first aperture aligned with the first plurality of contact pads;
performing a first test step by:
(1)(a) aligning the plurality of test probes with the first plurality of contact pads and the first aperture;
(1)(b) bringing a first cluster probe located outside of the first contact pad footprint and the first aperture into contact with the mask membrane, the membrane thereby preventing engagement of the first probe with the electrical device and returning a test result form the first probe to the testing apparatus; and
(1)(c) a first remainder of the plurality of cluster test probes passing through the first aperture and into electrical contact with the first array of contact pads in a first electrical engagement.

25. The method of claim 24, further comprising the steps of:
providing a second electrical device on the module top surface, the second electrical device having a second plurality of contact pads arrayed in the distribution pitch on a second device top surface defining a composite two-dimensional second contact pad footprint divergent from the probe footprint and the first contact pad footprint;
the mask membrane defining a second aperture aligned with the second plurality of contact pads; and
performing a second test step by:
(2)(a) aligning the plurality of test probes with the second plurality of contact pads with a second cluster probe located inside the first pad footprint and outside of the second contact pad footprint and the second aperture;
(2)(b) bringing the second probe into contact with the mask membrane, the membrane thereby preventing engagement of the second probe with the electrical device and return of a test result from the second probe to the testing apparatus; and
(2)(c) a second remainder of the plurality of test probes passing through the second aperture and into electrical contact with the second array of contact pads in a second electrical engagement.

26. The method of claim 24, wherein the mask membrane is a flexible and resilient non-conductive membrane.

27. The method of claim 26, wherein the mask membrane is selected from the group comprising Kapton and Mylar.

28. The method of claim 24 wherein the cluster probes have a travel distance dimension of about 3 mils; and
the mask membrane has a thickness of form about 2 to about 3 mils.

29. The method of claim 25, further comprising the steps of:
the first and second at least one probes exerting a common maximum force on the membrane; and
the first and second remainder of probes exerting the common maximum force upon the contact pads.

30. The method of claim 24, further comprising the steps of:
attaching an alignment frame to the mask membrane; and
the alignment frame interacting with the module to align the first aperture with the first array of contact pads.

* * * * *

UNITED STATES PATENT AND TRADEMARK OFFICE
CERTIFICATE OF CORRECTION

PATENT NO. : 6,984,997 B2
DATED : January 10, 2006
INVENTOR(S) : Yu et al.

It is certified that error appears in the above-identified patent and that said Letters Patent is hereby corrected as shown below:

Column 10,
Lines 11 and 12, delete "the computer control system".

Signed and Sealed this

Fourteenth Day of March, 2006

JON W. DUDAS
*Director of the United States Patent and Trademark Office*